(12) United States Patent
Easton et al.

(10) Patent No.: US 12,362,738 B2
(45) Date of Patent: Jul. 15, 2025

(54) COMPUTER-IMPLEMENTED METHOD OF GENERATING PWM CONTROL SIGNALS, AND CORRESPONDING COMPUTER PROGRAM, COMPUTER-READABLE STORAGE MEDIUM AND APPARATUS

(71) Applicant: CAMBRIDGE MECHATRONICS LIMITED, Cambridge (GB)

(72) Inventors: Mark Easton, Cambridge (GB); Chris Avery, Cambridge (GB)

(73) Assignee: CAMBRIDGE MECHATRONICS LIMITED, Cambridge (GB)

( * ) Notice: Subject to any disclaimer, the term of this patent is extended or adjusted under 35 U.S.C. 154(b) by 0 days.

(21) Appl. No.: 18/266,223

(22) PCT Filed: Dec. 14, 2021

(86) PCT No.: PCT/GB2021/053292
§ 371 (c)(1),
(2) Date: Jun. 8, 2023

(87) PCT Pub. No.: WO2022/129894
PCT Pub. Date: Jun. 23, 2022

(65) Prior Publication Data
US 2024/0097666 A1 Mar. 21, 2024

(30) Foreign Application Priority Data

Dec. 14, 2020 (GB) ........................................ 2019726
Dec. 14, 2020 (GB) ........................................ 2019727

(51) Int. Cl.
*H03K 7/08* (2006.01)
*H04N 23/52* (2023.01)
(Continued)

(52) U.S. Cl.
CPC ............... *H03K 7/08* (2013.01); *H04N 23/52* (2023.01); *H04N 23/55* (2023.01);
(Continued)

(58) Field of Classification Search
CPC ........ G02B 27/646; H03K 7/08; H04N 23/52; H04N 23/54; H04N 23/55; H04N 23/667;
(Continued)

(56) References Cited

U.S. PATENT DOCUMENTS

| 2011/0277462 A1* | 11/2011 | Gregory | ................ H04N 23/55 60/527 |
| 2012/0019680 A1* | 1/2012 | Shimada | ............... H04N 25/617 348/208.99 |

(Continued)

FOREIGN PATENT DOCUMENTS

| WO | 2020/152481 A1 | 7/2020 |
| WO | 2020/228392 A1 | 11/2020 |

OTHER PUBLICATIONS

Examination and Search Report of GB Application GB2019726.5 dated Aug. 5, 2021, p. 10.

(Continued)

*Primary Examiner* — Levi Gannon
(74) *Attorney, Agent, or Firm* — Van Hoven PC; Stefan D. Osterbur; Joshua Van Hoven

(57) ABSTRACT

A computer-implemented method driving an actuator component that drives movement of a movable part relative to a support structure, an image sensor fixed relative to the movable part or the support structure. The image sensor carries out CDS so as to read, offset in time by a sampling period, a reference signal and a light-sensing signal, and outputs a sync signal prior to CDS. The method comprises receiving the sync signal; generating PWM control signals at a PWM frequency substantially equal to an integer multiple
(Continued)

of the reciprocal of the sampling period; during a sensing interval, suspending generating PWM control signals to drive the actuator component; and scheduling the sensing interval to start a time delay after receiving the sync signal, such that the sensing interval overlaps with both or neither of a duration of reading the reference signal and a substantially equal duration of reading the light-sensing signal by the image sensor.

20 Claims, 8 Drawing Sheets

(51) Int. Cl.
*H04N 23/55* (2023.01)
*H04N 23/68* (2023.01)
*H04N 23/73* (2023.01)
*H04N 25/60* (2023.01)
*H04N 25/616* (2023.01)
*H04N 25/71* (2023.01)
*H04N 25/76* (2023.01)
*H04N 25/779* (2023.01)

(52) U.S. Cl.
CPC ........... *H04N 23/687* (2023.01); *H04N 23/73* (2023.01); *H04N 25/60* (2023.01); *H04N 25/616* (2023.01); *H04N 25/745* (2023.01); *H04N 25/7795* (2023.01)

(58) Field of Classification Search
CPC .... H04N 23/687; H04N 23/73; H04N 25/616; H04N 25/745; H04N 25/7795
See application file for complete search history.

(56) References Cited

U.S. PATENT DOCUMENTS

2022/0141357 A1\* 5/2022 Easton ................... H04N 23/54
　　　　　　　　　　　　　　　　　　　　　348/340
2022/0196967 A1\* 6/2022 Dai ......................... H04N 23/60

OTHER PUBLICATIONS

Examination and Search Report of GB Application GB2019727.3 dated Aug. 6, 2021, p. 8.
International Search Report and Written Opinion received for PCT Patent Application No. PCT/GB2021/053292, mailed on Apr. 8, 2022, 12 pages.

\* cited by examiner

COMPUTER-IMPLEMENTED METHOD OF GENERATING PWM CONTROL SIGNALS, AND CORRESPONDING COMPUTER PROGRAM, COMPUTER-READABLE STORAGE MEDIUM AND APPARATUS

CROSS-REFERENCE TO RELATED APPLICATIONS

This application is a national stage application under 35 U.S.C. § 371 of International Application No. PCT/GB2021/053292, filed Dec. 14, 2021, which claims priority of GB Patent Application Nos. 2019726.5, filed Dec. 14, 2020, and 2019727.3, filed Dec. 14, 2020, the disclosures of each of which are hereby incorporated by reference herein in their entireties.

The present application generally relates to a computer-implemented method of generating PWM control signals, for example for application to an SMA actuator assembly. The present application also relates to a corresponding computer program, a computer-readable storage medium and an apparatus comprising an actuator assembly and a controller.

There are a variety of types of actuator assembly in which it is desired to provide positional control of a movable part relative to a support structure. Such actuator assemblies may be used in cameras, in which a lens element and an image sensor are moved relative to each other. For example, WO 2013/175197 A1 discloses a SMA actuator assembly in which a total of four SMA wires are used to move a lens element relative to an image sensor in a plane orthogonal to the optical axis of the lens element, thereby providing optical image stabilization (OIS). An alternative SMA actuator assembly in which SMA wires are used to provide OIS by moving a movable image sensor relative to a lens element is disclosed in WO 2017/072535 A1. WO2007/113478 A1 and WO 2019/243849 A1 disclose an apparatus in which SMA wire is used to move a lens element relative to an image sensor in a direction along the optical axis of the lens element, thereby providing auto-focus or zoom functionality.

In each of these types of actuator assembly, an image sensor is arranged in close proximity to an actuator component in the form of an SMA wire. Driving the actuator component, by switching the electrical power through the actuator component, may give rise to electro-magnetic interference (EMI) in the image sensor. Such EMI may become apparent in the form of noise in the image that is captured by the image sensor, thus degrading the quality of the images captured by the image sensor. The problem can be more pronounced in battery-operated devices such as mobile phones, which tend to operate with a restricted power budget. This results in widespread use of pulse width modulation (PWM) techniques that can improve efficiencies, but which can lead to increased EMI.

The present invention is concerned with avoiding or at least reducing the effect of EMI on the quality of an image captured by the image sensor.

According to the present invention, there is provided a computer-implemented method of generating PWM control signals and a measurement pulse for applying to an actuator component that drives movement of a movable part relative to a support structure. An image sensor is fixed relative to the movable part or the support structure. The image sensor carries out correlated double sampling (CDS) so as to read, offset in time by a sampling period, a reference signal and a light-sensing signal. The image sensor outputs a sync signal prior to CDS. The method comprises receiving the sync signal; generating pulse width modulated (PWM) control signals to drive the actuator component at a PWM frequency substantially equal to an integer multiple of the reciprocal of the sampling period; during a sensing interval, suspending generating PWM control signals to drive the actuator component, and generating a measurement pulse to measure an electrical characteristic of the actuator component; and scheduling the sensing interval to start a time delay after receiving the sync signal, and setting the time delay and the duration of the sensing interval such that the sensing interval overlaps with both or neither of a duration of reading the reference signal and a substantially equal duration of reading the light-sensing signal by the image sensor.

According to the present invention, there is also provided a computer program product comprising instructions which, when the program is executed by a computer, cause the computer to carry out the method.

According to the present invention, there is also provided a computer-readable storage medium comprising instructions which, when executed by a computer, cause the computer to carry out the method.

According to the present invention, there is also provided an apparatus comprising: an actuator assembly comprising a support structure and a movable part supported on the support structure, and an actuator component configured to drive movement of the movable part relative to the support structure; an image sensor fixed relative to the support structure or the movable part, wherein the image sensor is configured to carry out correlated double sampling (CDS) so as to read, offset in time by a sampling period, a reference signal and a light-sensing signal, and to output a sync signal prior to CDS; and a controller configured to: generate pulse width modulated (PWM) control signals to drive the actuator component at a PWM frequency substantially equal to an integer multiple of the reciprocal of the sampling period; during a sensing interval, suspend generating PWM control signals to drive the actuator component, and generate a measurement pulse to measure an electrical characteristic of the actuator component; receive the sync signal from the image sensor, and schedule the sensing interval to start with a time delay after receiving the sync signal, wherein the controller is configured to set the time delay, a duration of the sensing interval, and a timing and duration of the measurement pulse so as to avoid switching the measurement pulse and PWM control signal applied to the actuator component for the duration of reading the reference signal and for a substantially equal duration of reading the light-sensing signal by the image sensor.

According to the present invention, there is also provided a computer-implemented method of generating PWM control signals for applying to an actuator component that drives movement of a movable part relative to a support structure. The image sensor is fixed relative to the movable part or the support structure. The image sensor carries out correlated double sampling (CDS) so as to read, offset in time by a sampling period, a reference signal and a light-sensing signal, and to output a sync signal prior to CDS. The method comprises: receiving the sync signal; generating pulse width modulated (PWM) control signals to drive the actuator component at a PWM frequency substantially equal to an integer multiple of the reciprocal of the sampling period; and scheduling modification of the pulse width of the PWM control signals to take place with a time delay after receiving the sync signal, so as to avoid modifying the pulse width of the PWM control signals during a duration of reading the reference signal and a substantially equal duration of reading the light-sensing signal by the image sensor.

According to the present invention, there is also provided an apparatus comprising: an actuator assembly comprising a support structure and a movable part supported on the support structure, and an actuator component configured to drive movement of the movable part relative to the support structure; an image sensor fixed relative to the support structure or the movable part, wherein the image sensor is configured to carry out correlated double sampling (CDS) so as to read, offset in time by a sampling period, a reference signal and a light-sensing signal, and to output a sync signal prior to CDS; and a controller configured to: generate pulse width modulated (PWM) control signals to drive the actuator component at a PWM frequency substantially equal to an integer multiple of the reciprocal of the sampling period; during a sensing interval, suspend generating PWM control signals to drive the actuator component, and generate a measurement pulse to measure an electrical characteristic of the actuator component; receive the sync signal from the image sensor, and schedule modification of the pulse width of the PWM control signals to take place with a time delay after receiving the sync signal, so as to avoid modifying the pulse width of the PWM control signals during a duration of reading the reference signal and a substantially equal duration of reading the light-sensing signal by the image sensor.

The present invention may be embodied as a computer-implemented method or an apparatus. Accordingly, the present invention may take the form of an entirely hardware embodiment, an entirely software embodiment, or an embodiment combining software and hardware aspects.

Furthermore, the present techniques may take the form of a computer program product. Such a computer program product may be in the form of code and/or data that may be distributed between a plurality of coupled components in communication with one another. The invention may comprise a controller which includes a microprocessor, working memory and program memory coupled to one or more of the components of a system.

The computer program product may be embodied in a computer readable medium having computer readable program code thereon. The computer readable medium may be a computer readable signal medium or a computer readable storage medium. A computer readable medium may be, for example, but is not limited to, an electronic, magnetic, optical, electromagnetic, infrared, or semiconductor system, apparatus, or device, or any suitable combination of the foregoing. The computer-readable storage medium may be, for example, a solid state memory, a microprocessor, programmed memory such as non-volatile memory (such as Flash), or read-only memory (firmware), or on a data carrier such as an optical or electrical signal carrier.

All or part of the computer-implemented method according to embodiments of the present invention may suitably be embodied in a logic apparatus comprising logic elements to perform the steps of the above-described methods, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

Implementations of the present techniques will now be described, by way of example only, with reference to the accompanying drawings, in which.

Figure 1:
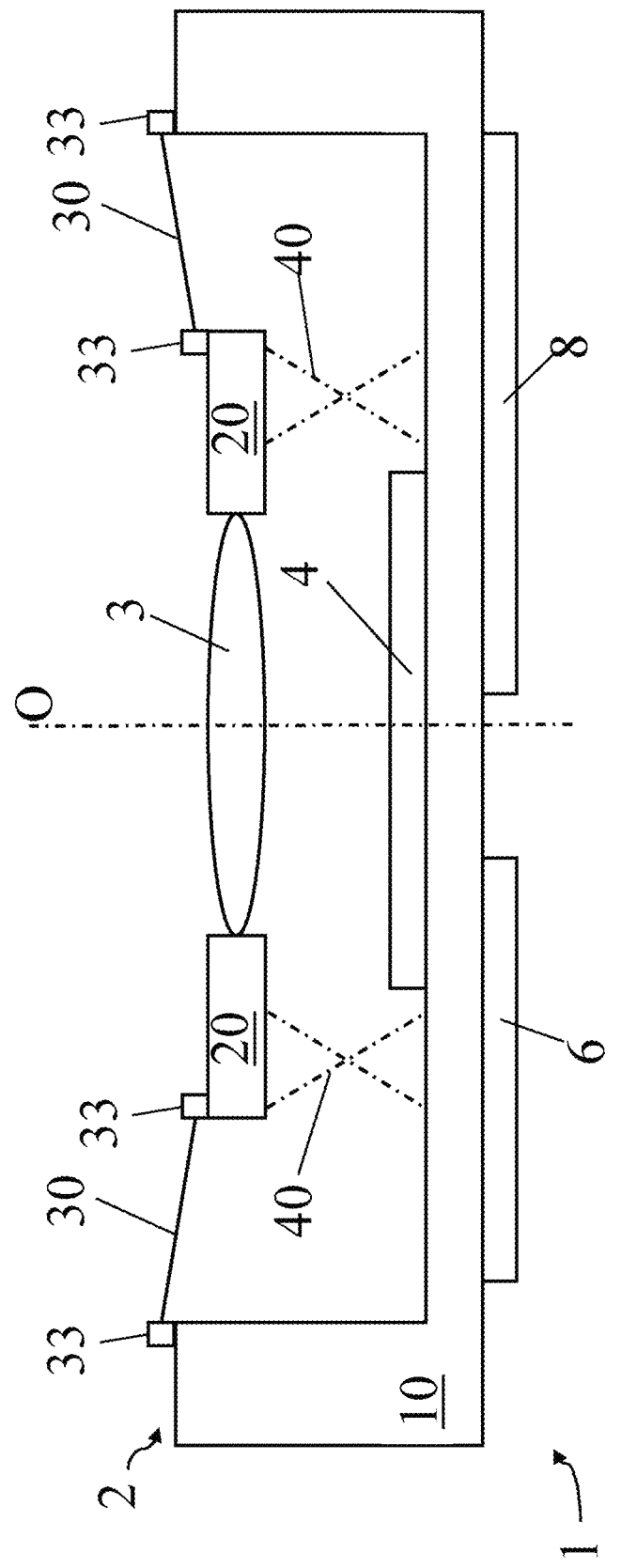
FIG. 1 shows an apparatus comprising an SMA actuator assembly in accordance with embodiments of the present invention.

FIG. 1 schematically shows an apparatus 1 in accordance with an embodiment of the present invention. The apparatus 1 is, for example, a camera apparatus 1. The apparatus 1 is to be incorporated in a portable electronic device such as a mobile telephone, or tablet computer. Thus, miniaturisation is an important design criterion.

The apparatus comprises an actuator assembly 2. The actuator assembly 2 comprises a support structure 10 and a movable part 20. The movable part 20 is supported on the support structure 10. The movable part 20 is movable relative to the support structure 10. For example, the movable part 20 may be supported in a manner allowing movement of the movable part 20 relative to the support structure 10 in a plane orthogonal to an axis O. Movement along the axis O may be constrained or prevented. Alternatively or additionally, the movable part 20 is supported in a manner allowing movement of the movable part 20 relative to the support structure 10 along the axis O. Movement orthogonal to the axis O may be constrained or prevented. The axis O coincides with the optical axis O of optical components (such as a lens 3) of the apparatus 1.

The actuator assembly 2 of FIG. 1 comprises one or more SMA wires 30. The SMA wires 30 are connected in tension between the support structure 10 and the movable part 20. The SMA wires 30 are connected at their ends to the support structure 10 and/or to the movable part 20 using connection elements 33, for example crimp connections. The crimp connections may crimp the SMA wires 30 to hold the SMA wires 30 mechanically, as well as providing electrical connections to the SMA wires 30. However, any other suitable connections may alternatively be used. The SMA wires 30 are capable, on selective contraction, of driving movement of the movable part 20 with respect to the support structure 10 in one or more degrees of freedom.

The movable part 20 may be supported (so suspended) on the support structure 10 exclusively by the SMA wires 30. However, preferably, the actuator assembly 2 comprises a bearing arrangement 40 that supports the movable part on the support structure 10. The bearing arrangement 40 may have any suitable form for allowing movement of the movable part 20 with respect to the support structure 10. For this purpose, the bearing arrangement 40 may, for example, comprise a rolling bearing, a flexure bearing or a plain bearing.

The camera apparatus 1 further comprises a lens assembly 3 and an image sensor 4. The lens assembly 3 comprises one or more lenses configured to focus an image on the image sensor 4. The image sensor 4 captures an image and may be of any suitable type, for example a charge coupled device (CCD) or a CMOS device. The lens assembly 3 comprises a lens carrier, for example in the form of a cylindrical body, supporting the one or more lenses. The one or more lenses may be fixed in the lens carrier, or may be supported in the lens carrier in a manner in which at least one lens is movable along the optical axis O, for example to provide zoom or focus, such as auto-focus (AF). The apparatus 1 may be a miniature camera apparatus in which the or each lens of the lens assembly 3 has a diameter of 20 mm or less, preferably of 12 mm or less.

In the embodiment shown in FIG. 1, the movable part 20 comprises the lens assembly 3. The image sensor 4 may be fixed relative to the support structure 10, i.e. mounted on the support structure 10. In other embodiments (not shown), the lens assembly 3 may be fixed relative to the support structure 10 and the movable part 20 may comprise the image sensor 4. In either embodiment, in operation the lens assembly 3 is moved relative to the image sensor 4. This has the effect that the image on the image sensor 4 is moved and/or changed in focus. So, optical image stabilization (OIS) or autofocus (AF) or other focus or zoom functionality may be implemented in the apparatus 1.

The camera apparatus 1 further comprises a controller 8. The controller 8 may be implemented in an integrated circuit (IC) chip. The controller 8 generates drive signals for the SMA wires 30. SMA material has the property that on heating it undergoes a solid-state phase change that causes the SMA material to contract. Thus, applying drive signals to the SMA wires 30, thereby heating the SMA wires 30 by allowing an electric current to flow, will cause the SMA wires 30 to contract and move the movable part 20. The drive signals are chosen to drive movement of the movable part 20 in a desired manner, for example so as to achieve OIS by stabilizing the image sensed by the image sensor 4 and/or to achieve AF by focusing the image on the image sensor 4. The controller 8 supplies the generated drive signals to the SMA wires 30.

Optionally, the camera apparatus comprises a vibration sensor 6. The vibration sensor 6 may be a gyroscope sensor, for example, although in general other types of vibration sensor 6 could be used. The vibration sensor 6 detects vibrations that the camera apparatus 1 is experiencing and generates output signals representative of the vibration of the camera apparatus 1. The controller 8 receives the output signals, and generates the drive signals for the SMA wires 30 in response to the output signals, for example so as to counteract the vibrations represented by the output signals. The controller 8 may thus control the SMA wires 30 to achieve OIS.

In embodiments of the apparatus 1, OIS is performed. In such embodiments, the apparatus 1 may comprise the SMA actuation apparatus described in WO2013/175197 A1, or the SMA actuation apparatus of WO 2011/104518 A1, or the camera assembly of WO2017/072525, each of which is herein incorporated by reference. In other embodiments of the apparatus 1, AF is performed. In such embodiments, the apparatus 1 may comprise the camera lens actuation apparatus of WO2007/113478 A1 or the SMA actuation apparatus of WO 2019/243849, each of which is herein incorporated by reference.

Generally, however, the apparatus 1 according to the present invention is any apparatus 1 comprising an arrangement in which an actuator component, such as an SMA wire 30, drives movement of an arrangement associated with an image sensor 4. In such an apparatus 1, the drive signals supplied to the SMA wire 30 can result in EMI in the image sensor 4. Such EMI can cause interference or noise in the image signal, which can take the form of one or more lines which appear to move across a display screen that displays the image captured by the image sensor 4. An object of the present invention is to prevent or at least reduce EMI in the image sensor 4 due to the signals applied to the SMA wire 30.

Figure 2:
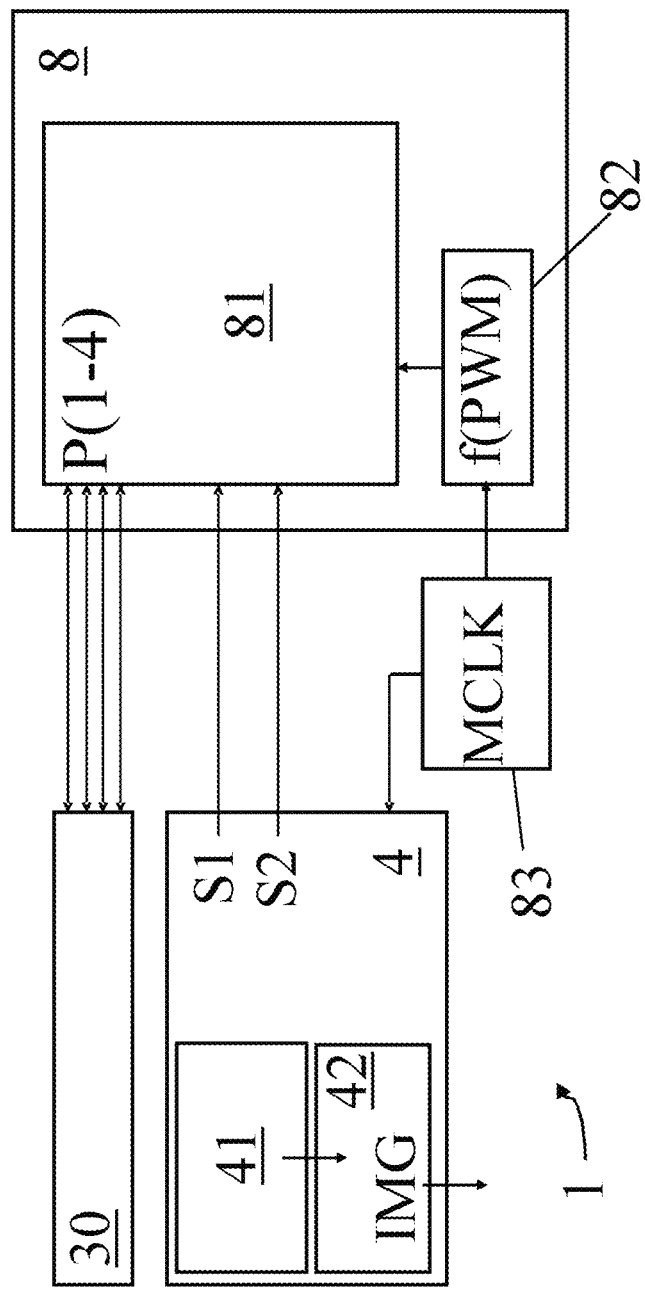
FIG. 2 shows a schematic block diagram of the control of the SMA actuator assembly and the image sensor.

FIG. 2 shows a block diagram that schematically illustrates control of the SMA wires 30 in the apparatus 1, in accordance with an embodiment of the invention. In the illustrated embodiment, the controller 8 comprises a PWM driver 81 and a frequency multiplier 82. The PWM driver 81 generates pulse width modulated (PWM) control signals P(1-4) to drive the SMA wires 30. In the illustrated embodiment, the PWM driver 81 generates four PWM control signals P(1-4). Each PWM control signal P(1-4) controls a different one of the four SMA wires 30. In general, the PWM driver 81 may generate any number of PWM control signals, to control any number of SMA wires 30. The frequency multiplier 82 sets the frequency f(PWM) of the PWM control signals P(1-4). The frequency multiplier 82 is, for example, a phase locked loop (PLL).

A master oscillator 83 generates a master clock signal MCLK. The master clock signal MCLK is received by the frequency multiplier 82. The frequency multiplier 82 may multiply and/or divide the received master clock signal MCLK so as to generate a clock signal with the PWM frequency f(PWM). The master clock signal MCLK is also applied to the image sensor 4. The master oscillator 83 may be part of the controller 8, or may generally be implemented in any component of a device in which the apparatus 1 is integrated. The master oscillator 83 may, for example, correspond to the oscillator that provides a clock signal to the main processor of such a device. In some embodiments, a dedicated oscillator or other clock generator may be provided to generate the PWM frequency f(PWM) instead of the master oscillator 83.

The image sensor 4 comprises an array of pixels 41. The pixels 41 are light-sensitive pixels 41. The array of pixels 41 may be a square array, although in general an array of any shape may be provided. The array of pixels 41 comprises rows and columns of pixels 41. The image sensor 4 further comprises an analogue to digital converter (ADC) 42. The ADC 42 reads the signals generated by the pixels 41, and outputs image data IMG. The image sensor 4 thus captures an image. The image data IMG may be received by a processor (not shown) and displayed on a display of any device incorporating the apparatus 1. The image sensor 4 also generates and outputs a sync signal S1, also referred to as a first sync signal S1 herein. Optionally, the image sensor 4 generates a second sync signal S2 and/or further sync signals. The sync signals S1, S2 are received by the PWM driver 81.

FIGS. 3 to 6 schematically depict signals that are used by the controller 8 and by the image sensor 4. The signals P1-P4 correspond to the PWM control signals applied to the four SMA wires 30. The CDS signal (described in more detail immediately below) is used by the ADC 42 of the image sensor 4 to read signals generated by the pixels 41. The signals S1 and S2 correspond to sync signals that are output by the image sensor 4 and received by the controller 8.

The CDS signal is used by the ADC 42. The ADC 42 carries out correlated double sampling (CDS) to read the signals generated by the pixels 41. In the context of this invention, CDS generally refers to obtaining a reference signal and a light-sensing signal of a pixel 41. The reference signal is taken in a known reference state of the pixel 41. The known reference state is for example a dark, non-exposed state of the pixel 41, i.e. a state in which light does not fall onto the pixel 41. The reference signal may also be referred to as a reset signal or dark signal. The light-sensing signal is taken in an unknown measurement state of the pixel 41. The unknown measurement state may be an illuminated state of the pixel 41, i.e. a state in which the pixel is exposed to light. The image sensor 4 generates pixel data based on the reference signal and the light-sensing signal, for example by subtracting the reference signal from the light-sensing signal. CDS reduces noise in data generated by the pixel of the image sensor 4, compared to a situation in which only the light-sensing signal is read.

As part of carrying out CDS and reading the reference signal and the light-sensing signal, the ADC 41 uses the CDS signal. The CDS signal comprises a reference ramp 55 and a sensing ramp 56. The reference ramp 55 is used by the ADC 41 to read the reference signal of the pixels 41. The duration t(ref) of the reference ramp 55 corresponds to the duration of reading the reference signal. The substantially equal duration of reading the light-sensing signal, i.e. the duration at the beginning of reading the light-sensing signal that is equal to the duration of reading the reference signal by the image sensor 4, is denoted t(ref). The sensing ramp 56 is used by the ADC 41 to read the light-sensing signal of the pixels 41. The duration t(sns) of the sensing ramp 56 corresponds to the duration of reading the light-sensing signal. The duration t(sns) is generally longer than the duration t(ref), because it takes longer to read the comparably larger light-sensing signal than the reference signal from the pixels 41. The duration The time between the start of the reference ramp 55 and the start of the sensing ramp 56 is herein referred to as the sampling period t(CDS). The reference signal and the light-sensing signal are read offset in time by the sampling period t(CDS).

The PWM control signals P1-P4 each comprise a pulse train. The frequency of the pulse train is the PWM frequency f(PWM). The period between starts of adjacent pulses in the PWM control signals P1-P4 is the PWM period t(PWM). The pulses of the PWM control signals P1-P4 are preferably square pulses as shown in FIGS. 3-6, although in general pulses with other shapes may also be used. Switching the PWM control signals P1-P4 thus gives rise to rising or falling edges in the PWM control signals. As shown in FIGS. 3-6, the amplitude of the pulses of the PWM control signal P1-P4 is preferably constant, such that the power applied to the SMA wires 30 is controlled solely or at least primarily by adjusting the width of the pulses of the PWM control signals P1-P4. In some embodiments, the amplitude of the PWM control signals P1-P4 may also be adjusted so as to provide additional control of the power provided to the SMA wires 30.

Preferably, none of the PWM control signals P1-P4 overlap, so the pulses of the PWM control signals P1-P4 are scheduled to be generated sequentially and not concurrently. The PWM control signals P1-P4 may thus be interleaved, as shown in FIGS. 3-6. However, in general, some or all of the PWM control signals P1-P4 may overlap, at least in certain situations (such as low temperature operation of the actuator assembly 2).

The inventors have found that, generally, switching the PWM control signals P1-P4 during the duration t(ref) of the reference ramp 55 and during a substantially equal duration t(ref) of the sensing ramp 56 may result in noise in the image data IMG due to EMI in the image sensor 4. However, avoiding any switching of the PWM control signal P1-P4 during durations t(ref) reduces the duty of the PWM control signals, and so limits the maximum power that can be provided to the SMA wires 30.

In accordance with the present invention, the PWM frequency f(PWM) is equal to an integer multiple of the reciprocal of the sampling period t(CDS). So, the period t(PWM) between subsequent PWM pulses is equal to or a fraction of the sampling period t(CDS). This ensures that any rising or falling edge of a PWM pulse that takes place during duration t(ref) of the reference ramp 55 also takes place during the substantially equal duration t(ref) of the sensing ramp 56, as illustrated by arrows 59 in FIGS. 3-6. Any noise due to EMI resulting from such rising and falling edges thus appears in both the reference signal and the light-sensing signal. Because CDS removes the reference signal from the light-sensing signal so as to create image data IMG, such noise is not present in the final image data IMG. Setting the PWM frequency f(PWM) equal to an integer multiple of the reciprocal of the sampling period t(CDS) thus reduces noise in the image sensor 4 due to EMI from the SMA wires 30.

The sampling period t(CDS) is a specification of the image sensor 4. The sampling period t(CDS) may thus be known at the time of implementing the controller 8. In instances in which the sampling period t(CDS) is not accurately known to the designer of the controller 8, one approach to determine a suitable PWM frequency f(PWM) is to sweep all possible PWM frequencies and determine empirically which contribute least noise to the resultant image. It is then possible to set the PWM frequency f(PWM), taking this knowledge into account, such that the image is degraded as little as possible. Some degree of error in setting the PWM frequency f(PWM) equal to an integer multiple of the reciprocal of the sampling period t(CDS) may be acceptable. So, the PWM frequency f(PWM) need not be exactly equal to an integer multiple of the reciprocal of the sampling period t(CDS), but may be substantially equal. For example, the PWM frequency f(PWM) may be in a range from 0.9 to 1.1, preferably from 0.95 to 1.05, further preferably from 0.98 to 1.02 times, particularly preferably from 0.995 to 1.0045 times, the integer multiple of the reciprocal of the sampling period t(CDS).

In addition to generating the PWM control signals P1-P4, the controller 8 may measure an electrical characteristic, such as the resistance, of the SMA wires 30. The length of the SMA wire 30 is a function of the resistance of the SMA wire 30. The measured electrical characteristic may thus provide a measure of the length of a respective SMA wire 30, and so ultimately allows determination of the position of the movable part 20 relative to the support structure 10. The determined position of the movable part 20 relative to the support structure 10 may be compared to a desired position of the movable part 20 relative to the support structure 10, and the PWM control signal P1-P4 may be adjusted to bring the movable part 20 closer to the desired position. So, the controller 8 may comprise closed loop control to generate the PWM control signals P1-P4. The measured electrical characteristic, or a measure (such as the length of the SMA wires 30) derived from the measured electrical characteristic may be fed back to the closed loop control.

The controller 8 may determine the electrical characteristic of an SMA wire 30 during a respective sensing interval 50. During the sensing interval 50, the PWM control signals P1-P4 that are used to drive the SMA wires 30 are suspended. This is schematically shown in FIGS. 3 to 6, in which during the sensing interval 50 the PWM control signals P1-P4 are shown in dotted lines, indicating that the PWM control signals P1-P4 are not applied during the sensing interval 50. In general, specifically the PWM control signal P2 of the SMA wire 30 to which the measurement pulse 50 is to be applied may be suspended, or all PWM control signals P1-P4 may be suspended.

Figure 3:
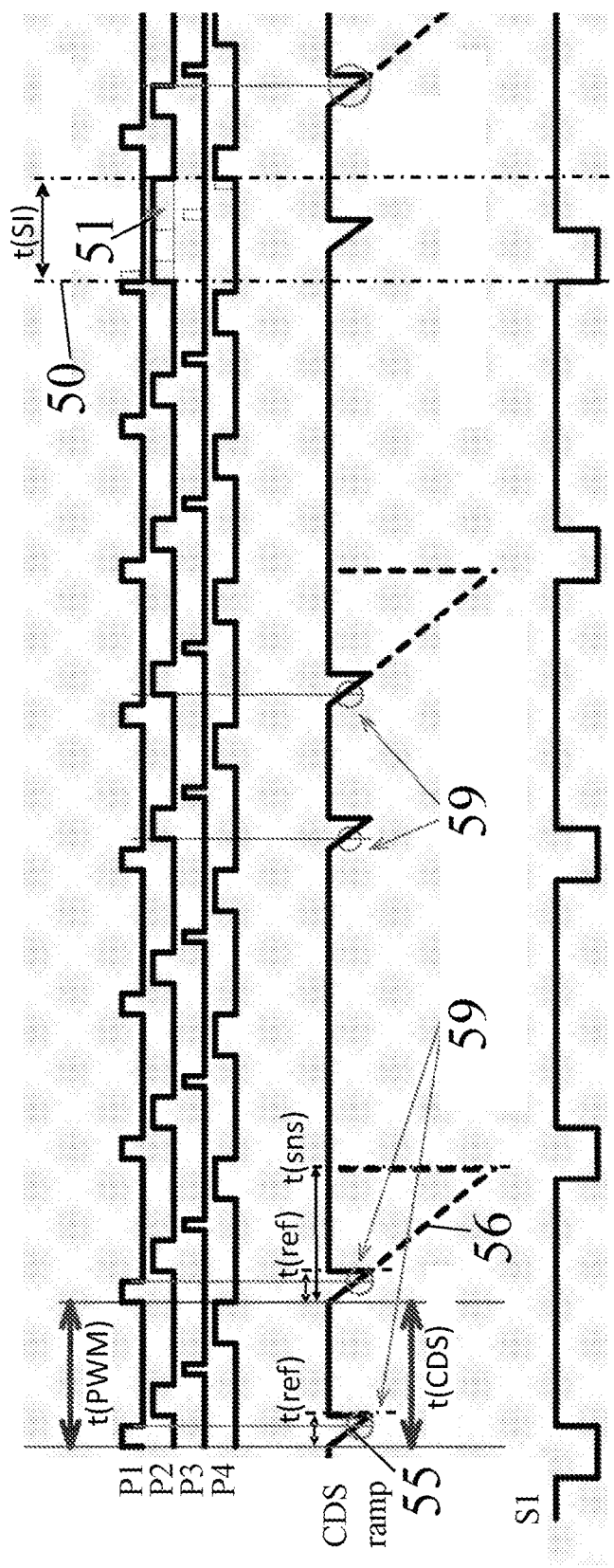
FIG. 3 shows signals that may be applied to the SMA wires and to the image sensor.

FIG. 3 schematically depicts a situation in which the sensing interval 50 is scheduled without taking the CDS signal into account. As shown, in such a situation, the sensing interval 50 may overlap (i.e. occur concurrently) with the reference ramp 55 but not the sensing ramp 56. So, while the PWM control signals P1-P4 are suspended during the reference ramp 55, they are not suspended during the duration t(ref) of the sensing ramp 56. FIG. 3 shows that as a result, a falling edge of a pulse of the PWM control signal P2 occurs during the duration t(ref) of the sensing ramp 56. Such a falling edge does not occur during the duration of the corresponding reference ramp 55. As a result, EMI may affect reading the light-sensing signal by the ADC. Such EMI is not cancelled by CDS, because the reference signal is not affected by EMI. So, the image data IMG that is output by the ADC 41 undesirably includes a contribution due to EMI.

Figure 4:
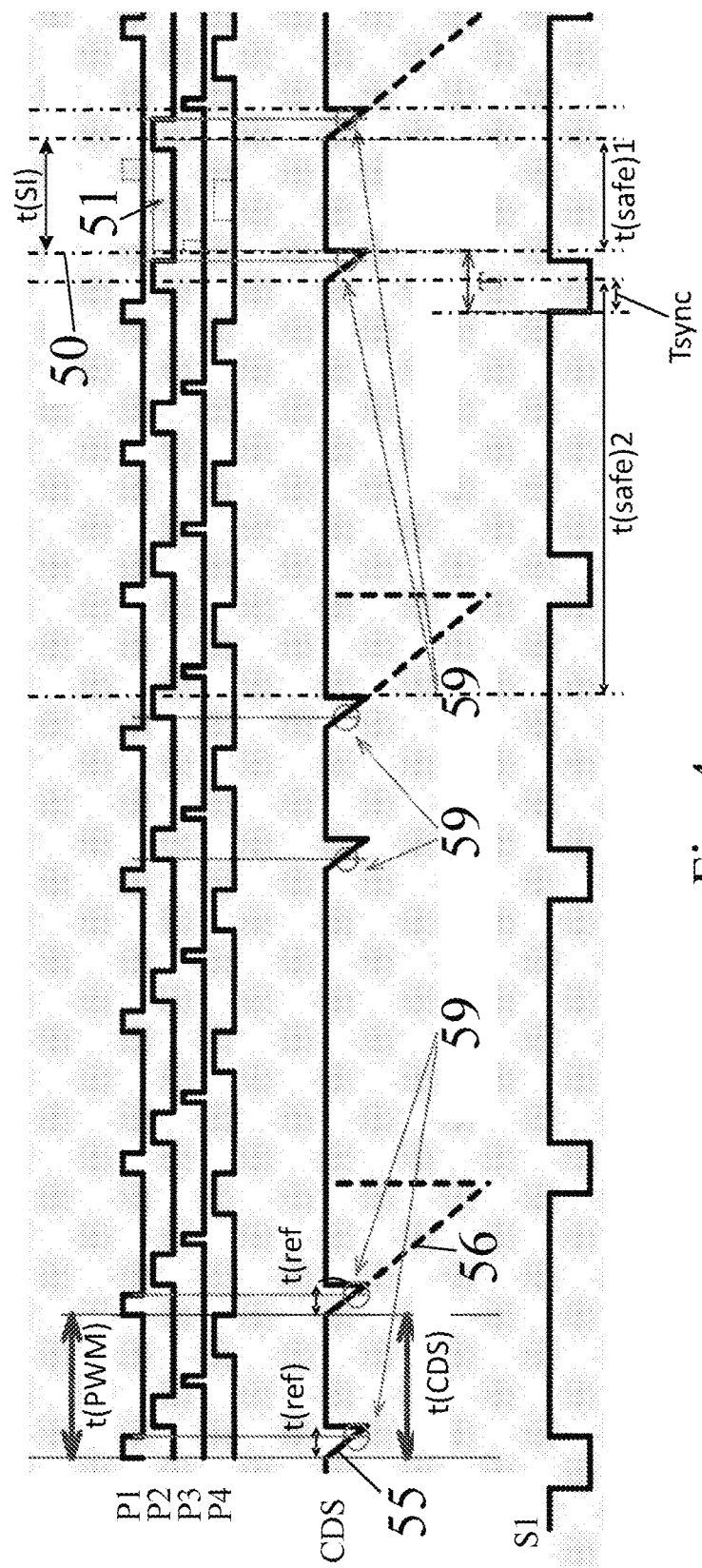
FIG. 4 shows an embodiment of scheduling a sensing interval in accordance with the present invention.
Figure 5:
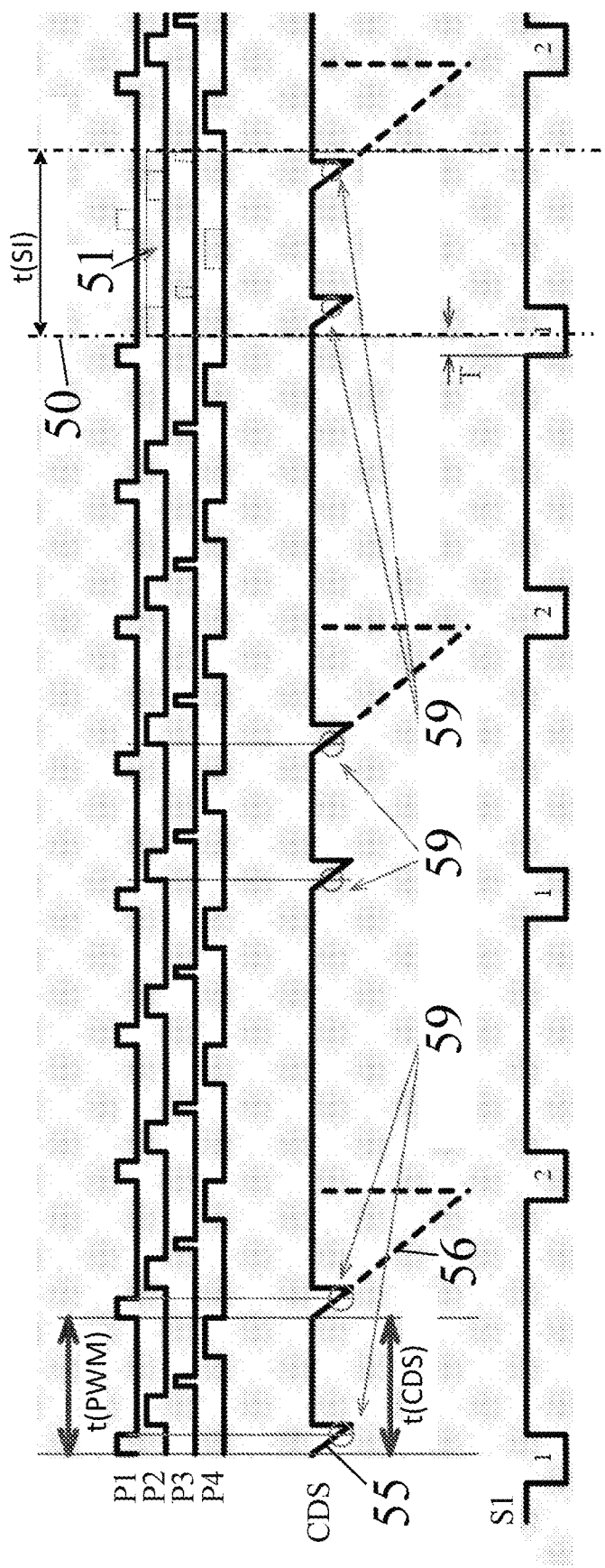
FIG. 5 shows another embodiment of scheduling a sensing interval in accordance with the present invention.
Figure 6:
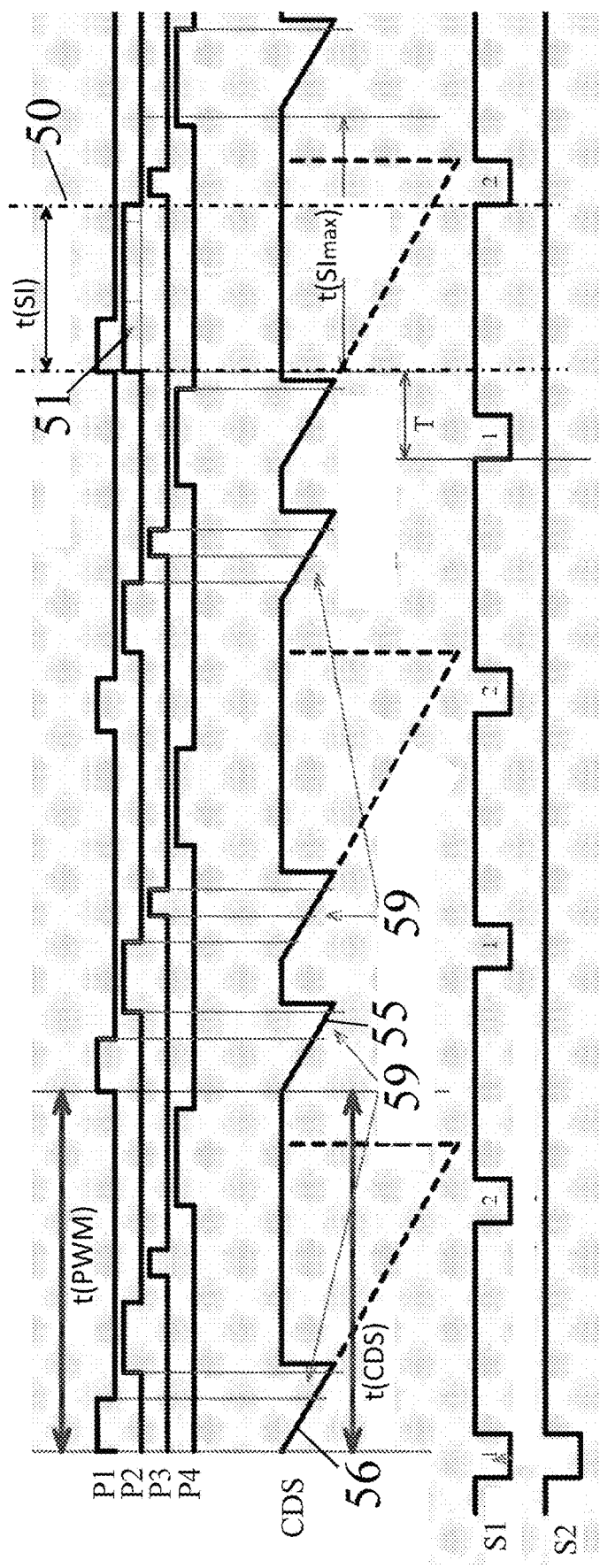
FIG. 6 shows another embodiment of scheduling a sensing interval in accordance with the present invention.

The present invention is concerned with addressing this problem. In accordance with the present invention, the controller 8 schedules the sensing interval 50 so as to avoid or reduce an imbalance in noise in the reference signal and the light-sensing signal. FIGS. 4 to 6 depict examples of how the sensing interval 50 may be scheduled.

As shown in FIGS. 3 to 6, prior to CDS, the image sensor 4 outputs the first sync signal S1. The first sync signal S1 may be an HSYNC signal, i.e. a sync signal that is output by the image sensor 4 before reading a new line of the pixel array of the image sensor, for example. There is a deterministic relationship between output of the sync signal S1 and performing CDS. In particular, CDS may start a fixed time period Tsync after the sync signal S1 is output. The fixed time period Tsync may be 0. Typically, the fixed time period Tsync is in the order of μs.

In accordance with the present invention, the controller 8 schedules the sensing interval 50 to start a time delay T after receiving the sync signal S1. The time delay T and the duration t(SI) of the sensing interval 50 are set so as to straddle or avoid the reference ramp 55 and duration t(ref) of the sensing ramp 56. So, the sensing interval 50 may either i) overlap with both the duration t(ref) of reading the reference signal and the substantially equal duration t(ref) of reading the light-sensing signal by the image sensor 4, or else ii) overlap with neither the duration t(ref) of reading the reference signal and the substantially equal duration t(ref) of reading the light-sensing signal by the image sensor 4. In the former instance i), PWM control signals P1-P4 are suppressed during both the reference ramp 55 and duration t(ref) of the sensing ramp 56, and so EMI due to PWM control signals does not affect the reference and light-sensing signals. In the latter instance ii), PWM control signals P1-P4 are applied during both the reference ramp 55 and duration t(ref) of the sensing ramp 56, and so EMI due to the PWM control signals P1-P4 is ultimately cancelled in the image data IMG due to CDS.

The delay between the sync signal S1 and performing CDS, as well as the CDS period t(CDS), may be specifications of the image sensor 4. This delay may thus be known at the time of implementing the controller 8, and the time delay T and the duration t(SI) of the sensing interval 50 may thus be set accordingly. In instances in which the delay is not accurately known to the designer of the controller 8, the time delay T and the duration t(SI) may be determined empirically by sweeping possible time delays T and durations t(SI) and determining which contribute the least noise to an image taken by the image sensor. In some embodiments (as discussed in relation to FIG. 7), the first sync signal S1 may encode information for deriving the CDS period t(CDS). In such embodiments, the duration t(SI) of the sensing interval 50 may be determined based on the first sync signal SI.

FIG. 4 shows an embodiment in which the sensing interval 50 overlaps with neither the duration t(ref) of reading the reference signal and the substantially equal duration t(ref) of reading the light-sensing signal by the image sensor 4. In particular, the sensing interval 50 is between the reference ramp 55 and the sensing ramp 56. The time delay is set such that the sensing interval 50 starts after the earlier of the duration t(ref) of reading the reference signal and the substantially equal duration t(ref) of reading the light-sensing signal. The duration t(SI) of the sensing interval 50 is set shorter than the sampling period t(CDS). The sensing interval 50 ends before the later of reading the reference signal and reading the light-sensing signal.

The sensing interval 50 in FIG. 4 is illustrated as taking place for the entire duration between the reference ramp 55 and the sensing ramp 56. In general, the sensing interval 50 may be shorter than the entire duration between the reference ramp 55 and the sensing ramp 56. The sensing interval 50 may occur at any time and for any duration between the reference ramp 55 and the sensing ramp 56. The sensing interval 50 may occur for a pre-defined minimum duration, to allow for enough time to measure the electrical characteristic of a respective SMA wire 30.

In the embodiment of FIG. 4, the sensing interval 50 is scheduled to take place between the duration t(ref) of reading the reference signal and the substantially equal duration t(ref) of reading the light-sensing signal by the image sensor 4. Alternatively, the sensing interval 50 may be scheduled to take place after the later of the duration t(ref) of reading the reference signal and the substantially equal duration t(ref) of reading the light-sensing signal by the image sensor 4. The duration t(SI) of the sensing interval 50 may be set such that the sensing interval ends before the next occurrence of CDS. In general, the sensing interval 50 may take place at any time during times t(safe)1 or t(safe)2 illustrated in FIG. 4.

FIG. 5 shows an embodiment in which the sensing interval 50 overlaps with both the duration t(ref) of reading the reference signal and the substantially equal duration t(ref) of reading the light-sensing signal by the image sensor 4. The time delay T is set such that the sensing interval 50 starts before the earlier one of reading the reference signal and reading the light-sensing signal. The duration t(SI) of the sensing interval is set longer than the sampling period t(CDS). The sensing interval 50 ends after the later of the duration t(ref) of reading the reference signal and the substantially equal duration t(ref) of reading the light-sensing signal. The embodiment of FIG. 5 allows the sensing interval 50 to be longer than the sensing interval 50 of FIG. 4, which may be beneficial especially if the sampling period t(CDS) is relatively short and/or if a longer measurement pulse is to be applied to the SMA wire 30.

The sensing interval 50 in FIG. 5 is illustrated as taking place for an almost minimum duration that allows straddling both the reference ramp 55 and the sensing ramp 56. In general, the sensing interval 50 may be longer than this minimum duration. For example, the sensing interval 50 may start at any time after the preceding occurrence of CDS, and end at any time before the subsequent occurrence of CDS. In some embodiments, the sensing interval 50 may straddle multiple pairs of reference ramp 55 and sensing ramp 56. This allows even longer sensing intervals 50 to be implemented compared to sensing intervals 50 that straddle a single pair of reference ramp 55 and sensing ramp 56.

The image sensor 4 may output the sync signal S1 at the same rate as carrying our CDS. For every instance of the sync signal S1, CDS may be carried out. Alternatively, as shown in FIGS. 3-6, the sync signal S1 may be output at a rate that is an integer multiple of the rate at which the image sensor 4 carries out CDS. FIGS. 3-6 show a sync signal S1 that is output at twice the rate at which the image sensor 4 carries out CDS.

In some embodiments, the sensing interval 50 may be scheduled to start a set time delay T after any one of the sync signals S1. In FIG. 4, for example, the time delay T and the duration t(SI) of the sensing interval 50 may be set such that the sensing interval occurs during time t(safe)1 after any sync signal S1. Similarly, in FIG. 5, the time delay T and the duration t(SI) of the sensing interval 50 may be set after any of the sync signals S1.

In some other embodiments, it may be desirable to schedule the sensing interval 50 only after some of the first sync signals S1. This may be the case, for example, in situations in which the sensing ramp 56 precedes the corresponding reference ramp 55. An example of this is shown in FIG. 6. Here, due to the sampling time t(CDS) being longer than the time period between subsequent sync signal pulses S1, the reference ramp 55 occurs after a sync signal S1 (labelled "2") that does not precede CDS. To avoid inadvertently switching during the reference ramp 55, the sensing interval 50 is thus scheduled to start a set time delay after the any one of a subset of sync signals S1 (labelled "1"). Another situation in which it is desirable to schedule the sensing interval 50 only after some of the first sync signals S1 is when the sensing interval 50 is to be scheduled during t(safe)2 in FIG. 4.

In order to identify sync signals S1 after which to schedule a sensing interval 50, the second sync signal S2 may be used. The second sync signal S2 is output by the image sensor 4 prior to capturing an image. For example, the second sync signal S2 may be a VSYNC signal, so a signal that is output by the image sensor 4 prior to capturing a new image frame. The second sync signal S2 is used to identify a subset of first sync signals S1 (labelled "1") that directly precede CDS. The sensing interval 50 is scheduled to start a set time delay after the identified sync signal S1 (labelled "1"). Alternatively, the second sync signal S2 may be used to identify a subset of first sync signals S1 (labelled "2") that does not directly precede CDS. For example, with reference to FIG. 4, the sensing interval 50 may be scheduled to occur during time t(safe)2, a time delay T after a sync signal S1 that does not directly precede CDS (not shown).

In FIGS. 4 to 6, the measurement pulse 51 is a square voltage pulse. However, the measurement pulse 51 may in general be any other pulse, for example a current pulse, that allows measuring of the electrical characteristic of the SMA wire 30. The measurement pulse 51 is not necessarily a square pulse, but may be a pulse with a slower or gradual onset and a slower or gradual descent. This may advantageously reduce any EMI in the image sensor 4 due to the measurement pulse 51. In general, the measurement pulse 51 may have any shape.

In FIGS. 4 to 6, the measurement pulse 51 is generated for the entire duration of the sensing interval 50. In other embodiments, the measurement pulse 51 may be generated for part of the duration of the sensing interval 50. The measurement pulse 51 could start and end at any time within the sensing interval 50. In some embodiments, the start time and duration of the measurement pulse 51 may be scheduled so as to avoid switching of the measurement pulse 51 for the duration t(ref) of the reference ramp 55 and for a substantially equal duration t(ref) of the sensing ramp 56. With reference to FIG. 5, for example, the measurement pulse 51 may be scheduled to start at the beginning of the depicted sensing interval 50, and end at a time between the reference ramp 55 and the sensing ramp 56. This may further reduce EMI due to the measurement pulse 51.

In FIGS. 3 to 6, the duty cycle (i.e. pulse widths) of the PWM control signals P1-P4 is shown to be constant. In practice, the duty cycle of the PWM control signals P1-P4 may be variable, to thereby control the power that is delivered to the respective SMA wires 30. The inventors have found that adjusting the duty cycle of the PWM control signals P1-P4 at a time between the reference ramp 55 and the sensing ramp 56 may lead to EMI in the image sensor 4. So as to avoid or reduce such EMI, in some embodiments, the controller 8 may schedule modifying the duty cycle of the PWM control signals P1-P4 at a time before the earlier one of reading the reference signal and reading the light-sensing signal and after the later of the duration of reading the reference signal and the substantially equal duration of reading the light-sensing signal. So, the controller 8 may schedule modifying the duty cycle of the PWM control signals P1-P4 outside a time between the reference ramp 55 and the sensing ramp 56.

Alternatively or additionally, the controller 8 may schedule modifying the duty cycle of the PWM control signals P1-P4 at a time outside the sensing interval 50. The sensing interval 50 may overlap with the entire or a large portion of the time between the reference ramp 55 and the sensing ramp 56, and so avoiding modifying the duty cycle of the PWM control signals P1-P4 during the sensing interval 50 may reduce EMI due to modifying the duty cycle. Scheduling the duty cycle modification with reference to the sampling interval 50 may be computationally more efficient than scheduling the duty cycle modification based on the sync signal S1.

The image sensor 4 may operate in a plurality of different operating modes. The controller 8 may receive data indicative of the operating mode of the image sensor 4. For example, the image sensor 4 may operate in a first mode for capturing high-resolution still images, and in a second mode for capturing a video stream. The relation between the first sync signal S1 and performing CDS, as well as the CDS ramps, may differ in the different operating modes. As such, the controller 8 may take the operating mode of the image sensor 4 into account when scheduling the sensing interval 50. In particular, the controller 8 may set one or more of the time delay, the duration of the sensing interval 50, and optionally the timing and duration of the measurement pulse 51 to different values for the different operating modes of the image sensor 4.

Figure 7:
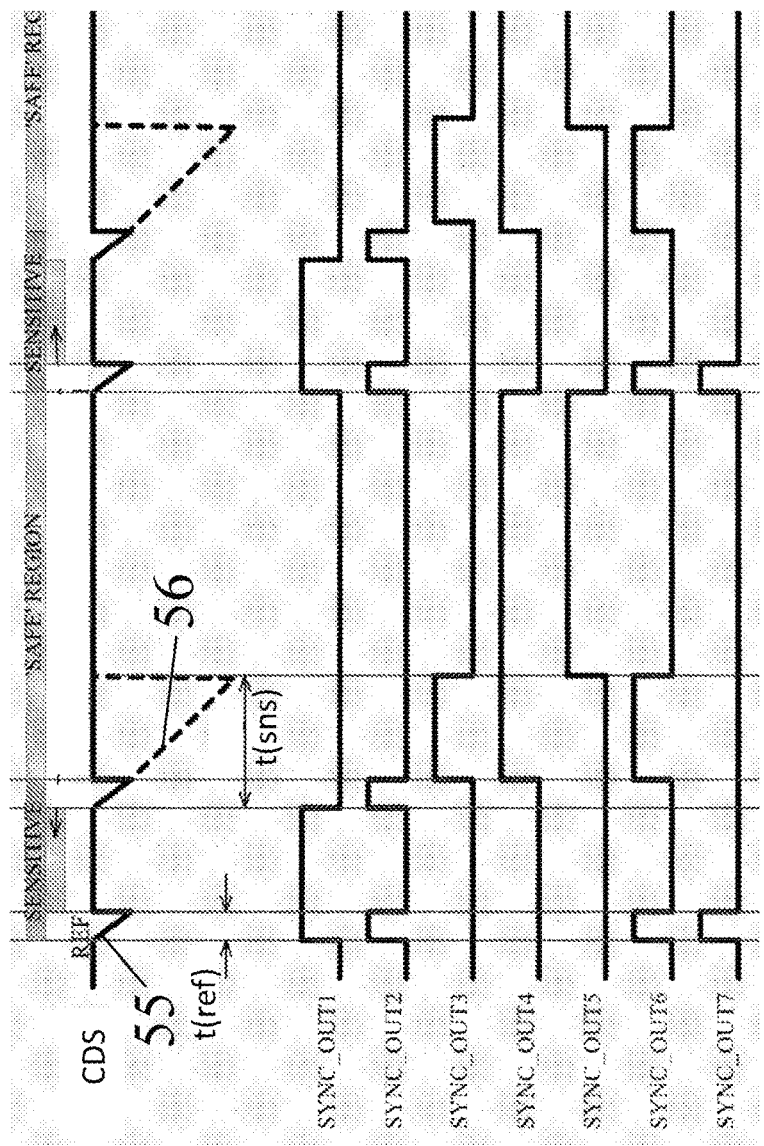
FIG. 7 shows examples of the first sync signal that is output by the image sensor.

As described above, the first sync signal S1 may be an HSYNC signal that is output by the image sensor 4. Alternatively, the first sync signal S1 may be any other sync signal S1 that has a deterministic relationship with performing CDS. The first sync signal S1 may or may not be a dedicated signal that is output by the image sensor 4 specifically for the purpose of scheduling the sensing interval 50. FIG. 7 shows several examples of suitable sync signals that may be used as the first sync signal S1 in accordance with embodiments of the invention.

The sync signal SYNC_OUT1 comprises a pulse that begins when the earlier of the reference ramp and the sensing ramp starts, and ends when the later of the reference ramp and the sensing ramp starts. The controller may determine the sampling period t(CDS) based on pulse width of sync signal SYNC_OUT 1. The controller 8 may determine the rate at which CDS is performed based on the frequency of the pulse of SYNC_OUT1. The controller 8 may set the PWM frequency based on the rate at which CDS is performed.

The sync signal SYNC_OUT2 comprises a sequence of two pulses that are respectively coincident with the duration t(ref) of the reference ramp and the substantially equal duration t(ref) of the sensing ramp. The controller 8 may determine the time between the start or end of the two pulses to determine the sampling period t(CDS). The controller 8 may determine the rate at which CDS is performed based on the frequency of the two pulses of SYNC_OUT2.

The sync signal SYNC_OUT3 comprises a pulse that starts after the duration t(ref) of the sensing interval, and ends at the end of the sensing interval. The controller 8 may schedule the sensing interval 50 to start after the start of the pulse of SYNC_OUT3, thereby avoiding the duration t(ref) of the reference ramp and the substantially equal duration t(ref) of the sensing ramp. Alternatively, the controller may schedule the sensing interval 50 to start after the end of the pulse of SYNC_OUT 3, thereby avoiding the reference and sensing ramps entirely.

The sync signal SYNC_OUT4 comprises a pulse that starts after the duration t(ref) of the sensing ramp, and ends at the start of the next occurrence of CDS. The controller 8 may schedule the sensing interval 8 at any time during the pulse of SYNC_OUT4.

The sync signal SYNC_OUT5 comprises a pulse that starts after the sensing ramp and ends at the start of the next occurrence of CDS. The controller 8 may schedule the sensing interval 8 at any time during the pulse of SYNC_OUT5.

The sync signal SYNC_OUT6 comprises a first pulse that coincides with the duration t(ref) of the reference ramp, and a second pulse that starts after the substantially equal duration t(ref) of the sensing ramp and ends at the end of the sensing ramp. The controller may schedule the sensing interval 50 outside the period between the start of the two pulses. The controller 8 may determine the rate at which CDS is performed based on the frequency of the pulses of SYNC_OUT6.

The sync signal SYNC_OUT7 comprises a pulse that coincides with the duration t(ref) of the reference ramp. The controller may determine the rate at which CDS is performed based on the frequency of the pulses of SYNC_OUT7.

Figure 8:
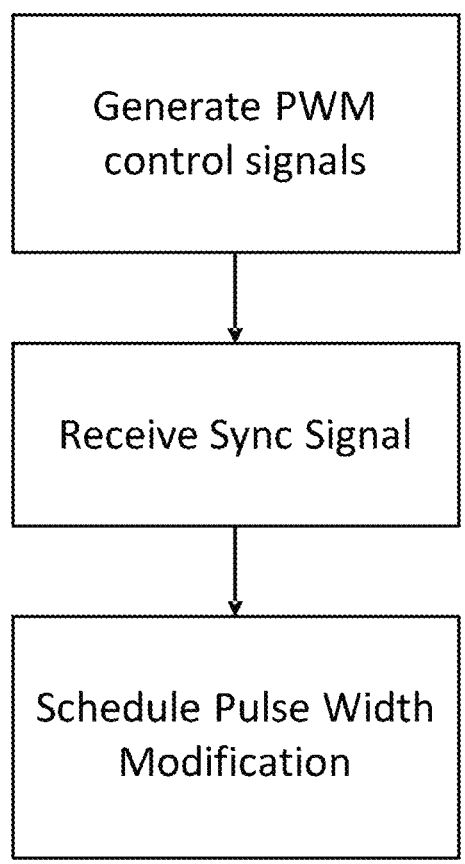
FIG. 8 shows a flow chart illustrating the scheduling of modifying pulse widths of the PWM control signals in accordance with embodiments of the present invention.

The present invention also relates to scheduling the modification of the pulse widths of the PWM control signals P1-4, as schematically depicted in FIG. 8. As described above, the duty cycle of the PWM control signals P1-P4 may be variable, so the pulse widths of the PWM control signals P1-P4 may be variable. This allows control of the power that is delivered to the respective SMA wires 30. In accordance with the present invention, scheduling modification of the pulse width of the PWM control signals P1-P4 may take place with a time delay after receiving the sync signal. The modification may be scheduled so as to avoid modifying the pulse width of the PWM control signals for a duration between reading the reference signal and reading the light-sensing signal by the image sensor, i.e. for the duration between the start of the reference ramp 55 and between the duration t(ref) of the sensing ramp 56, or for the duration between the start of the sensing ramp 56 and the end of the reference ramp 55.

The present invention has been described in connection with SMA wires 30. The term 'SMA wire' may refer to any element comprising SMA. The SMA wire may have any shape that is suitable for the purposes described herein. The SMA wire may be elongate and may have a round cross section or any other shape cross section. The cross section may vary along the length of the SMA wire. It is also possible that the length of the SMA wire (however defined) may be similar to one or more of its other dimensions. The SMA wire may be pliant or, in other words, flexible. In some examples, when connected in a straight line between two elements, the SMA wire can apply only a tensile force which urges the two elements together. In other examples, the SMA wire may be bent around an element and can apply a force to the element as the SMA wire tends to straighten under tension. The SMA wire may be beam-like or rigid and may be able to apply different (e.g. non-tensile) forces to elements. The SMA wire may or may not include material(s) and/or component(s) that are not SMA. For example, the SMA wire may comprise a core of SMA and a coating of non-SMA material. Unless the context requires otherwise, the term 'SMA wire' may refer to any configuration of SMA wire acting as a single actuating element which, for example, can be individually controlled to produce a force on an element. For example, the SMA wire may comprise two or more portions of SMA wire that are arranged mechanically in parallel and/or in series. In some arrangements, the SMA wire may be part of a larger piece of SMA wire. Such a larger piece of SMA wire might comprise two or more parts that are individually controllable, thereby forming two or more SMA wires.

Although the present invention has been described with reference to four SMA wires 30, and four PWM control signals P1-P4 that are applied to the four SMA wires 30, in general the present invention extends to the use of any number of SMA wires 30, and any number of corresponding PWM control signals. For example, a single PWM control signal may be applied to a single SMA wire 30 so as to drive movement of the movable part 20 relative to the support structure 10. The sensing interval 50 for the single SMA wire may be scheduled as described in this application.

The present invention has been described in connection with SMA wires 30 that, on contraction, move the movable part 20 relative to the support structure 10. SMA wire is advantageous as an actuator in such an actuator assembly, in particular due to its high energy density which means that the SMA wire required to apply a given force is of relatively small size. However, in general, other actuator components may be used instead of the SMA wires 30. Such actuator components, on actuation, move the movable part 20 relative to the support structure 10. Examples of such actuator components include, but are not limited to, voice-coil motors (VCM), MEMS devices or any other components capable of moving the movable part 20 relative to the support structure 10. Such actuator components may introduce EMI in an image sensor 4 that is fixed relative to the movable part 20 or support structure 10. Driving such actuator components in accordance with the present invention may reduce such noise. Measuring an electrical characteristic of these actuator components, for example an inductance of VCMs, may be used to determine an actuation amount of the actuator components. The determined actuation amount may be used to determine the actual position of a movable part 10 relative to the support structure 20.

The foregoing has described some embodiments of the present invention, but the present invention is not limited to these embodiments. The scope of the invention is defined in the appended claims.

The invention claimed is:

1. A computer-implemented method of generating PWM control signals and a measurement pulse for applying to an actuator component that drives movement of a movable part relative to a support structure, an image sensor being fixed relative to the movable part or the support structure, the image sensor carrying out correlated double sampling (CDS) so as to read, offset in time by a sampling period, a reference signal and a light-sensing signal, and to output a sync signal prior to CDS, wherein the method comprises:
   receiving the sync signal;
   generating pulse width modulated (PWM) control signals to drive the actuator component at a PWM frequency substantially equal to an integer multiple of the reciprocal of the sampling period;
   during a sensing interval, suspending generating PWM control signals to drive the actuator component, and generating a measurement pulse to measure an electrical characteristic of the actuator component; and
   scheduling the sensing interval to start a time delay after receiving the sync signal, and setting the time delay and a duration of the sensing interval such that the sensing interval overlaps with both or neither of a duration of reading the reference signal and a substantially equal duration of reading the light-sensing signal by the image sensor,
   wherein:
   the time delay is set such that the sensing interval starts after the earlier of the duration of reading the reference signal and the substantially equal duration of reading the light-sensing signal; and
   the duration of the sensing interval is set shorter than the sampling period so that the sensing interval ends before the later of reading the reference signal and reading the light-sensing signal.

2. The computer-implemented method of claim 1, further comprising:
   receiving first sync signals from the image sensor at a rate that is an integer multiple of the rate at which the image sensor is configured to carry out CDS; and
   scheduling the sensing interval to start a set time delay after any one of the first sync signals.

3. The computer-implemented method of claim 1, wherein the measurement pulse is generated for the entire duration of the sensing interval.

4. The computer-implemented method of claim 1, wherein:
   the measurement pulse is a voltage pulse and the electrical characteristic is a measure of the resistance of the actuator component; and
   during generation of the measurement pulse, the method further comprises measuring the electric current passing through the actuator component and determining the measure of the resistance based on the voltage pulse and the measured electric current.

5. The computer-implemented method of claim 1, further comprising deriving a measure of the actuation amount of the actuator component based on the measured electrical characteristic, wherein generating the PWM control signals comprises closed loop control and feeding back the measure of the actuation amount to the closed loop control.

6. The computer-implemented method of claim 1, wherein generating the PWM control signals comprises generating PWM control signals for a shape memory alloy (SMA) wire acting as an actuator component, the SMA wire, on contraction, driving movement of the movable part relative to the support structure.

7. The computer-implemented method of claim 1, further comprising generating PWM control signals to drive each of a plurality of actuator components at a PWM frequency substantially equal to an integer multiple of the reciprocal of the sampling period such that the plurality of actuator components drive movement of the movable part relative to the support structure, wherein the actuator component is one of the plurality of actuator components.

8. The computer-implemented method of claim 7, further comprising:
   generating the PWM control signals to drive each of the plurality of actuator components such that none of the PWM control signals overlap; and
   suspending generating PWM control signals for each of the actuator components during the sensing interval.

9. The computer-implemented method of claim 1, further comprising modifying a duty cycle of the PWM control signals at a time before the earlier one of reading the reference signal and reading the light-sensing signal and after the later of the duration of reading the reference signal and the substantially equal duration of reading the light-sensing signal.

10. The computer-implemented method of claim 1, further comprising modifying a duty cycle of the PWM control signals at a time outside the sensing interval.

11. The computer-implemented method of claim 1, further comprising:
   receiving data indicative of one of a plurality of different operating modes of the image sensor; and
   setting the time delay, the duration of the sensing interval, and the timing and duration of the measurement pulse to different values for the different operating modes of the image sensor.

12. A computer-implemented method of generating PWM control signals and a measurement pulse for applying to an actuator component that drives movement of a movable part relative to a support structure, an image sensor being fixed relative to the movable part or the support structure, the image sensor carrying out correlated double sampling (CDS) so as to read, offset in time by a sampling period, a reference signal and a light-sensing signal, and to output a sync signal prior to CDS, wherein the method comprises:
   receiving the sync signal;
   generating pulse width modulated (PWM) control signals to drive the actuator component at a PWM frequency substantially equal to an integer multiple of the reciprocal of the sampling period;
   during a sensing interval, suspending generating PWM control signals to drive the actuator component, and generating a measurement pulse to measure an electrical characteristic of the actuator component; and
   scheduling the sensing interval to start a time delay after receiving the sync signal, and setting the time delay and a duration of the sensing interval such that the sensing interval overlaps with both or neither of a duration of reading the reference signal and a substantially equal duration of reading the light-sensing signal by the image sensor,
   wherein:
   the time delay is set such that the sensing interval starts before the earlier one of reading the reference signal and reading the light-sensing signal; and the duration of the sensing interval is set longer than the sampling period so that the sensing interval ends after the later of the duration of reading the reference signal and the substantially equal duration of reading the light-sensing signal.

13. The computer-implemented method of claim 12, further comprising:
receiving first sync signals from the image sensor at a rate that is an integer multiple of the rate at which the image sensor is configured to carry out CDS; and
scheduling the sensing interval to start a set time delay after any one of the first sync signals.

14. The computer-implemented method of claim 12, wherein the measurement pulse is generated for the entire duration of the sensing interval.

15. The computer-implemented method of claim 12, wherein generating the PWM control signals comprises generating PWM control signals for an SMA wire acting as an actuator component, the SMA wire, on contraction, driving movement of the movable part relative to the support structure.

16. A computer-implemented method of generating PWM control signals and a measurement pulse for applying to an actuator component that drives movement of a movable part relative to a support structure, an image sensor being fixed relative to the movable part or the support structure, the image sensor carrying out correlated double sampling (CDS) so as to read, offset in time by a sampling period, a reference signal and a light-sensing signal, and to output a sync signal prior to CDS, wherein the method comprises:
receiving the sync signal;
generating pulse width modulated (PWM) control signals to drive the actuator component at a PWM frequency substantially equal to an integer multiple of the reciprocal of the sampling period;
during a sensing interval, suspending generating PWM control signals to drive the actuator component, and generating a measurement pulse to measure an electrical characteristic of the actuator component;
scheduling the sensing interval to start a time delay after receiving the sync signal, and setting the time delay and a duration of the sensing interval such that the sensing interval overlaps with both or neither of a duration of reading the reference signal and a substantially equal duration of reading the light-sensing signal by the image sensor;
receiving first sync signals from the image sensor at a rate that is an integer multiple of the rate at which the image sensor is configured to carry out CDS;
receiving a second sync signal from the image sensor, the second sync signal being output by the image sensor prior to capturing an image; and
identifying, based on the second sync signal, a subset of the first sync signals that directly precede CDS, and to schedule the sensing interval to start a set time delay after the identified subset of the first sync signals.

17. An apparatus comprising:
an actuator assembly comprising:
a support structure;
a movable part supported on the support structure; and
an actuator component configured to drive movement of the movable part relative to the support structure;
an image sensor fixed relative to the support structure or the movable part,
wherein the image sensor is configured to carry out correlated double sampling (CDS) so as to read, offset in time by a sampling period, a reference signal and a light-sensing signal, and to output a sync signal prior to CDS; and
a controller configured to:
generate pulse width modulated (PWM) control signals to drive the actuator component at a PWM frequency substantially equal to an integer multiple of the reciprocal of the sampling period;
during a sensing interval, suspend generating PWM control signals to drive the actuator component, and generate a measurement pulse to measure an electrical characteristic of the actuator component; and
receive the sync signal from the image sensor, and schedule the sensing interval to start with a time delay after receiving the sync signal, wherein controller is configured to set the time delay, a duration of the sensing interval, and a timing and duration of the measurement pulse so as to avoid switching the measurement pulse and PWM control signal applied to the actuator component for the duration of reading the reference signal and for a substantially equal duration of reading the light-sensing signal by the image sensor;
wherein:
the image sensor is configured to:
output first sync signals at a rate that is an integer multiple of the rate at which the image sensor is configured to carry out CDS; and
prior to capturing an image, output a second sync signal; and
the controller is configured to:
receive the first sync signals and the second sync signal;
identify, based on the second sync signal, a subset of the first sync signals that directly precede CDS; and
schedule the sensing interval to start a pre-determined time period after the identified subset of the first sync signals.

18. The apparatus of claim 17, wherein the actuator component is an SMA wire that is configured, on contraction, to drive movement of the movable part relative to the support structure.

19. The apparatus of claim 17, wherein:
the image sensor is configured to output first sync signals at a rate that is an integer multiple of the rate at which the image sensor is configured to carry out CDS; and
the controller is configured to receive the first sync signals and to schedule the sensing interval to start a pre-determined time period after any one of the first sync signals.

20. A computer-implemented method of generating PWM control signals for applying to an actuator component that drives movement of a movable part relative to a support structure, an image sensor being fixed relative to the movable part or the support structure, the image sensor carrying out correlated double sampling (CDS) so as to read, offset in time by a sampling period, a reference signal and a light-sensing signal, and to output a sync signal prior to CDS, wherein the method comprises:
receiving the sync signal;
generating pulse width modulated (PWM) control signals to drive the actuator component at a PWM frequency substantially equal to an integer multiple of the reciprocal of the sampling period;
scheduling modification of the pulse width of the PWM control signals to take place with a time delay after receiving the sync signal, so as to avoid modifying the pulse width of the PWM control signals for a duration between reading the reference signal and reading the light-sensing signal by the image sensor; and modifying the pulse width of the PWM control signals at a time before the earlier one of reading the reference signal and reading the light-sensing signal and after the later of the duration of reading the reference signal and the substantially equal duration of reading the light-sensing signal.

* * * * *